(12) United States Patent
Lai (10) Patent No.: US 11,586,107 B2
(45) Date of Patent: Feb. 21, 2023

(54) PHASE SHIFT MASK AND MANUFACTURING METHOD OF SEMICONDUCTOR DEVICE

(71) Applicant: Powerchip Semiconductor Manufacturing Corporation, Hsinchu (TW)

(72) Inventor: Yi-Kai Lai, Taoyuan (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 200 days.

(21) Appl. No.: 17/120,278

(22) Filed: Dec. 14, 2020

(65) Prior Publication Data
US 2022/0155673 A1 May 19, 2022

(30) Foreign Application Priority Data
Nov. 17, 2020 (TW) .................. 109140049

(51) Int. Cl.
*G03F 7/20* (2006.01)
*G03F 1/26* (2012.01)
*H01L 21/027* (2006.01)

(52) U.S. Cl.
CPC ............ *G03F 1/26* (2013.01); *G03F 7/70283* (2013.01); *H01L 21/0274* (2013.01)

(58) Field of Classification Search
CPC ... H01L 21/0274; G03F 1/26; G03F 7/70283; G03F 1/00; G03F 1/32
See application file for complete search history.

(56) References Cited

U.S. PATENT DOCUMENTS

| 5,302,477 | A | * | 4/1994 | Dao | ................... G03F 7/70283 430/311 |
| 7,354,682 | B1 | * | 4/2008 | Capodieci | ................ G03F 1/34 430/5 |
| 8,043,797 | B2 | | 10/2011 | Hansen | |
| 2003/0180629 | A1 | * | 9/2003 | Wu | .......................... G03F 1/34 430/311 |
| 2004/0002010 | A1 | | 1/2004 | Levenson | |

(Continued)

FOREIGN PATENT DOCUMENTS

| TW | 201447479 | 12/2014 |
| TW | 202018787 | 5/2020 |

OTHER PUBLICATIONS

"Office Action of Taiwan Counterpart Application", dated Aug. 19, 2021, p. 1-p. 3.

*Primary Examiner* — Deoram Persaud
(74) *Attorney, Agent, or Firm* — JCIPRNET (57) ABSTRACT

A phase shift mask suitable for forming a via pattern on a transferred object is provided. The phase shift mask has a first pattern region and a second pattern region. The phase shift mask includes a substrate and a phase shift pattern layer. The phase shift pattern layer is located on the substrate and is disposed corresponding to one of the first pattern region and the second pattern region. An optical phase difference corresponding to the first pattern region and the second pattern region is basically 180 degrees. The first pattern region has a via region away from the second pattern region. The second pattern region includes a plurality of strip patterns surrounding the via region.

8 Claims, 6 Drawing Sheets

(56) References Cited

U.S. PATENT DOCUMENTS

| | | | |
|---|---|---|---|
| 2004/0212796 A1* | 10/2004 | Adel | G03F 7/70633 |
| | | | 356/237.1 |
| 2004/0265708 A1* | 12/2004 | Misaka | G03F 1/26 |
| | | | 430/323 |
| 2006/0088772 A1 | 4/2006 | Zhang | |
| 2008/0226991 A1* | 9/2008 | Lin | G03F 1/80 |
| | | | 430/5 |
| 2009/0008722 A1 | 1/2009 | Zhang | |
| 2010/0159690 A1 | 6/2010 | Kasaoka et al. | |
| 2019/0303527 A1 | 10/2019 | Tien et al. | |
| 2020/0058586 A1 | 2/2020 | Guo et al. | |

\* cited by examiner

PHASE SHIFT MASK AND MANUFACTURING METHOD OF SEMICONDUCTOR DEVICE

CROSS-REFERENCE TO RELATED APPLICATION

This application claims the priority benefit of Taiwan application serial no. 109140049, filed on Nov. 17, 2020. The entirety of the above-mentioned patent application is hereby incorporated by reference herein and made a part of this specification.

BACKGROUND

Technical Field

The disclosure relates to a mask and a manufacturing method of a device, and in particular, relates to a phase shift mask and a manufacturing method of a semiconductor device.

Description of Related Art

The photolithography process is an important process in manufacturing of semiconductor devices. In such a process, a corresponding photomask is required to be used to form a corresponding patterned film layer on a substrate. When the photolithography process is performed through a conventional phase shift mask, light penetrating through the phase shift mask may cause the side lobe effect in the intensity distribution thereof owing to the phase of the electric field. In the photolithography process, when the side lobe effect becomes obvious, the process resolution may be correspondingly reduced.

SUMMARY

The disclosure provides a phase shift mask capable of reducing a side lobe effect in a photolithography process. As such, a process resolution may be correspondingly improved.

The disclosure provides a phase shift mask suitable for forming a via pattern on a transferred object. The phase shift mask has a first pattern region and a second pattern region. The phase shift mask includes a substrate and a phase shift pattern layer. The phase shift pattern layer is located on the substrate and is disposed corresponding to one of the first pattern region and the second pattern region. An optical phase difference corresponding to the first pattern region and the second pattern region is basically 180 degrees. The first pattern region has a via region away from the second pattern region. The second pattern region includes a plurality of strip patterns surrounding the via region.

In an embodiment of the disclosure, the phase shift pattern layer is disposed corresponding to the second pattern region.

In an embodiment of the disclosure, the strip patterns are disposed in a rotational symmetry manner of 180° in a closed region, and the via region is located in the closed region.

In an embodiment of the disclosure, the strip patterns are disposed in a rotational symmetry manner of 90° in a closed region.

In an embodiment of the disclosure, the strip patterns are not disposed in a plane symmetry manner in a closed region, and the via region is located in the closed region.

In an embodiment of the disclosure, widths of the strip patterns are basically identical to pitches among adjacent strip patterns.

In an embodiment of the disclosure, the strip patterns include a plurality of first strip patterns and a plurality of second strip patterns in a closed region, the first strip patterns have a first extending direction, the second strip patterns have a second extending direction, the first extending direction is basically perpendicular to the second extending direction, and the first strip patterns and the second strip patterns are disposed in a rotational symmetry manner.

In an embodiment of the disclosure, the strip patterns include a plurality of third strip patterns in the closed region, the third strip patterns have a third extending direction, the first extending direction is basically parallel to the third extending direction, and the first strip patterns and the third strip patterns are disposed in a rotational symmetry manner.

The disclosure further provides a manufacturing method of a semiconductor device including the following steps. A photoresist layer on a transferred object is exposed through the phase shift mask provided by an embodiment of the disclosure.

In an embodiment of the disclosure, the step of exposing is positive tone development.

To sum up, through the phase shift mask provided by the disclosure, the side lobe effect may be reduced in the photolithography process. Therefore, the process resolution may be correspondingly improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Several embodiments accompanied with figures are provided below to further describe the disclosure in details, but the embodiments provided below are not intended to limit the scope of the disclosure.

For ease of understanding, the same or similar devices, film layers, regions, or features will hereinafter be denoted by the same or similar reference numerals.

The terms mentioned in the text, such as "comprising", "including", and "having" are all open-ended terms, i.e., meaning "including but not limited to".

Regarding the term "basically" used in the text, the term may include an acceptable tolerance range. The tolerance range may mean within one or more standard deviations, or within, for example, ±30%, ±20%, ±15%, ±10%, ±5% of the stated value.

The term "basically" as used in the text is inclusive of the stated value and means within an acceptable range of deviation for the particular value as determined by a person of ordinary skill in the art, considering the measurement in question, the related measurement, manufacturing, and the error associated with measurement of the particular quantity (i.e., the limitations of the measurement system or the process system). For example, "basically" may mean within one or more standard deviations, or within, for example, ±3%, ±2%, ±15%, ±1%, ±0.5% of the stated value.

Wordings used to indicate directions in the text, such as "up" and "down", merely refer to directions in the figures. Therefore, the directional wordings are used to illustrate rather than limit the disclosure.

In addition, the figures are provided for illustrative purposes only and are not drawn according to the original dimensions. In other words, in one figure, the size of a member may be reduced or enlarged, and such reducing or enlargement may be a common usage method used by a person of ordinary skill in the art for clear presentation during description. For instance, in FIG. 5, a size of a transferred object 910 or a size of a photoresist layer 930 disposed thereon may be enlarged.

Figure 1:
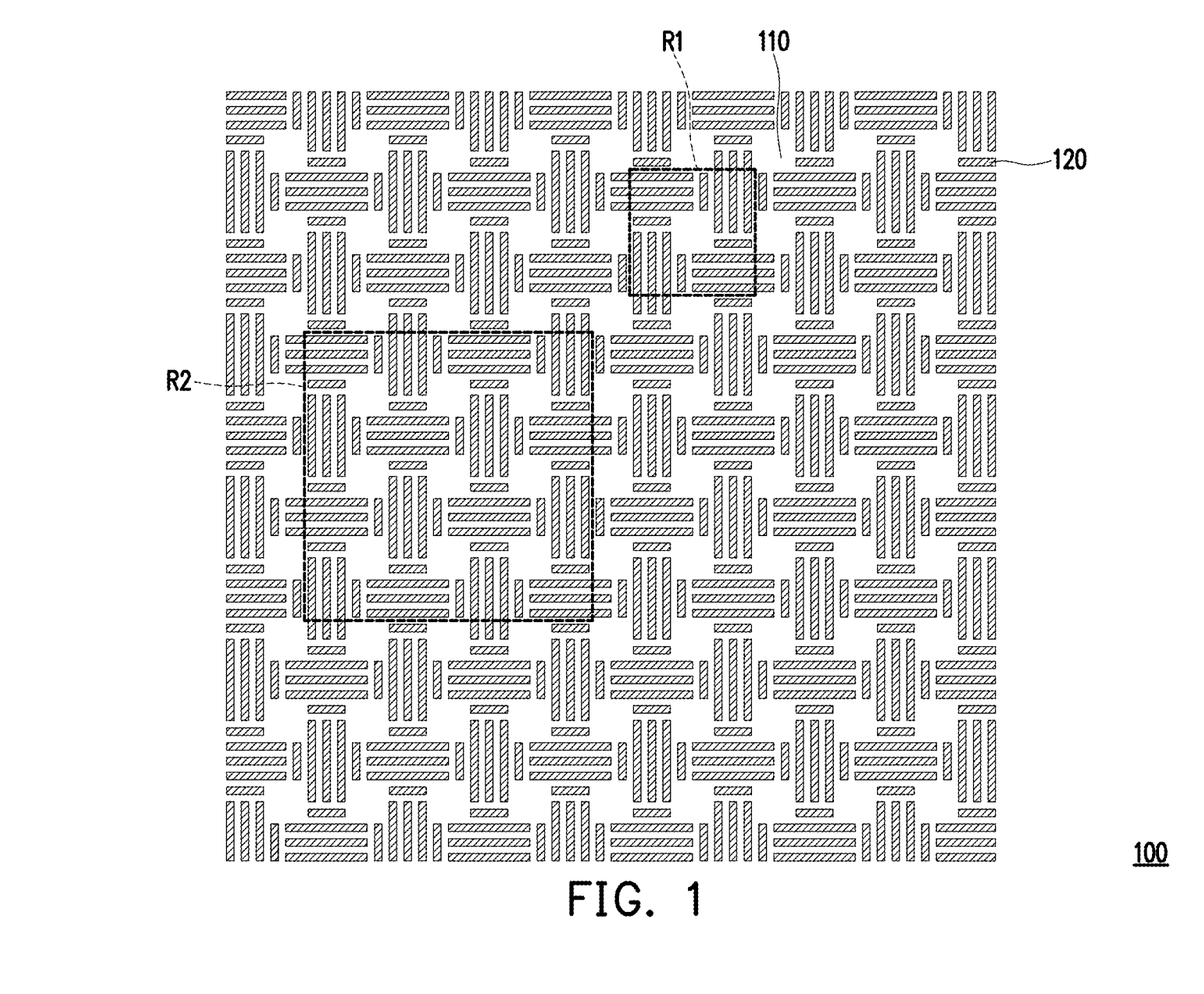
FIG. 1 is a schematic diagram of a portion of a phase shift mask according to an embodiment of the disclosure.
Figure 2:
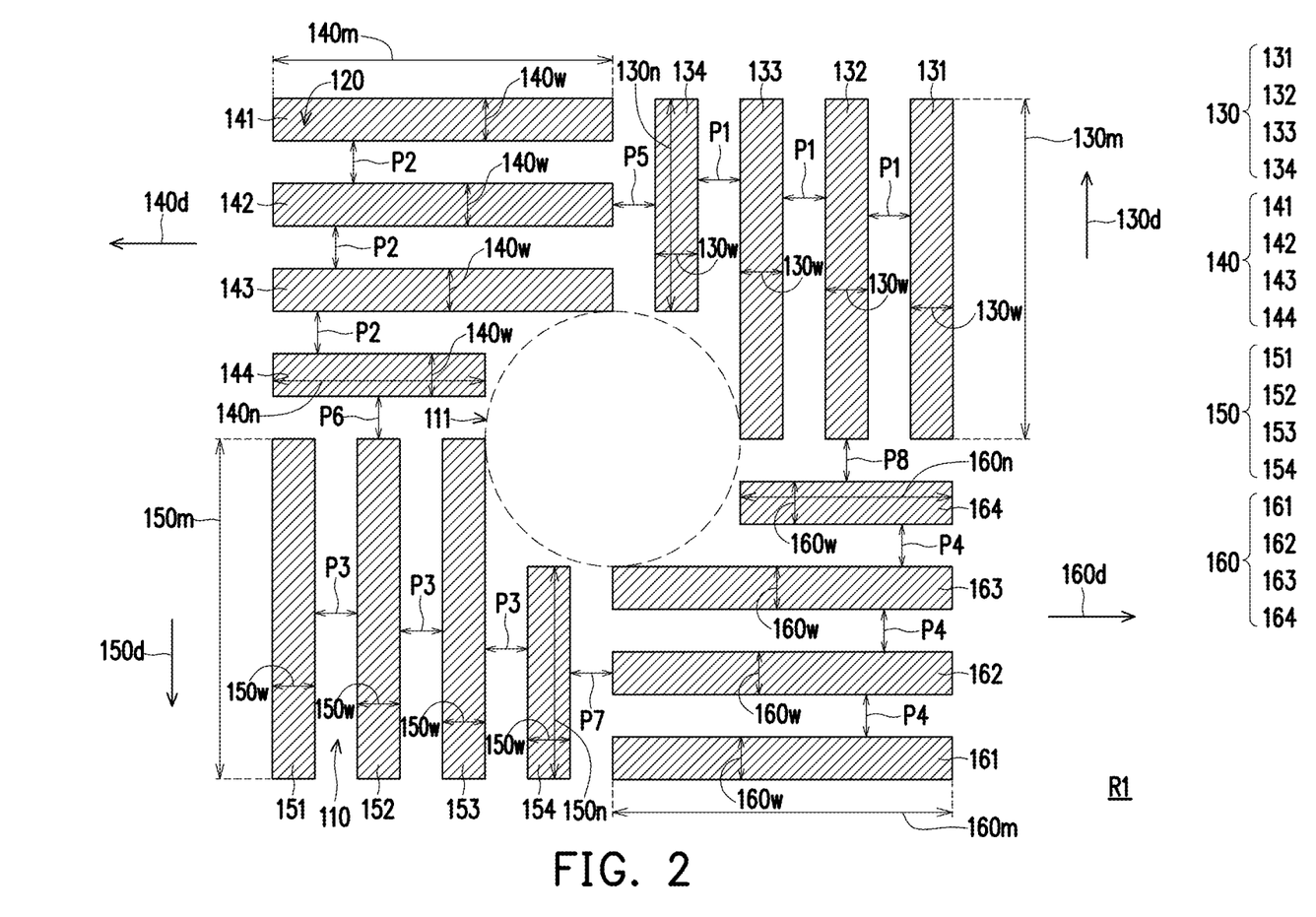
FIG. 2 is a schematic diagram of a portion of the phase shift mask according to an embodiment of the disclosure.

FIG. 1 is a schematic diagram of a portion of a phase shift mask according to an embodiment of the disclosure. FIG. 2 is a schematic diagram of a portion of the phase shift mask according to an embodiment of the disclosure. For instance, FIG. 2 may be an enlargement diagram corresponding to a region R1 in FIG. 1.

With reference to FIG. 1 and FIG. 2, a phase shift mask 100 has a first pattern region 110 and a second pattern region 120. The first pattern region 110 has a via region 111. The second pattern region 120 is away from the via region 111. The second pattern region 120 includes a plurality of strip patterns 130, 140, 150, and 160 surrounding the via region 111.

Figure 4:
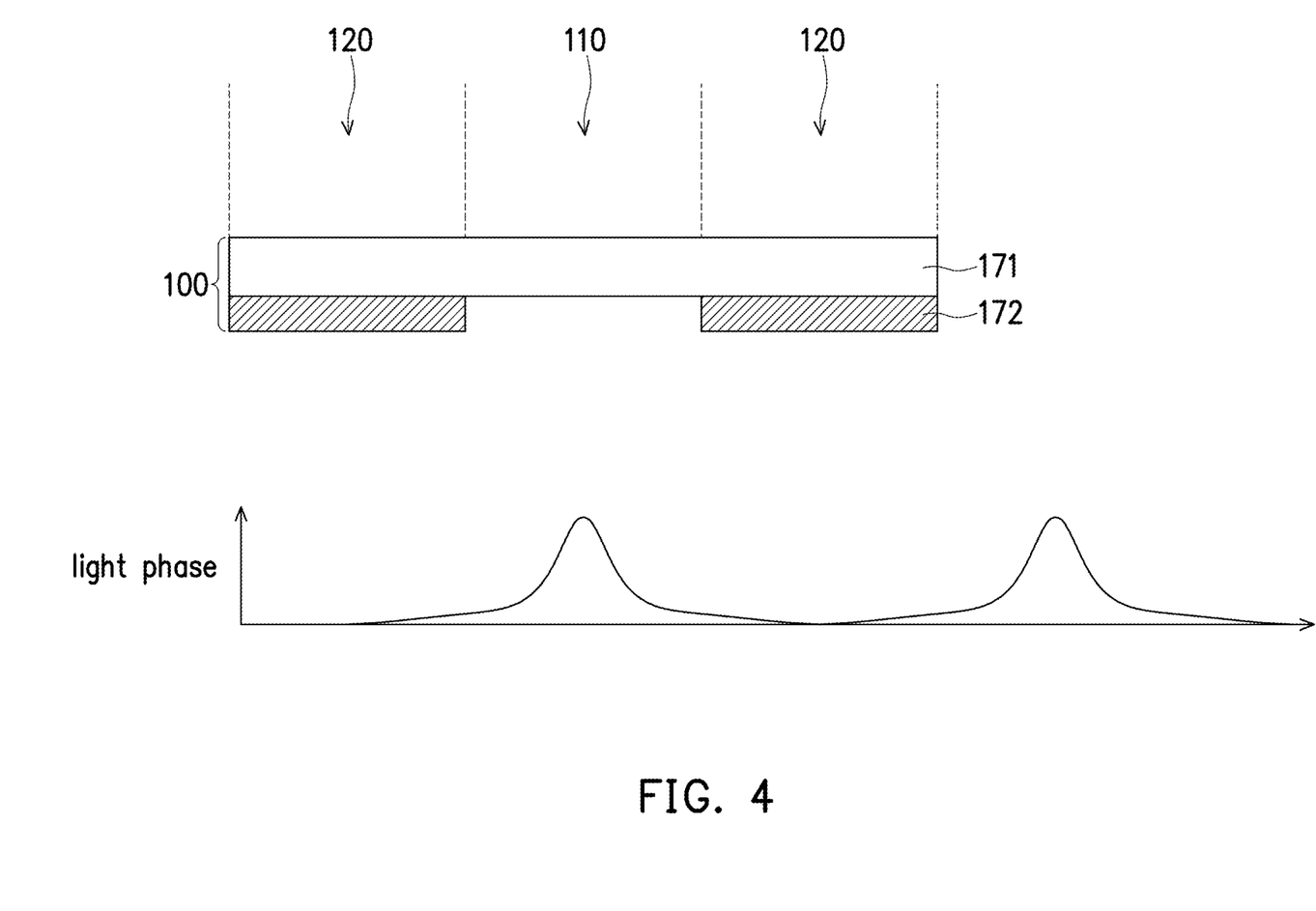
FIG. 4 is a schematic diagram of a light phase of a corresponding portion of the phase shift mask in a photolithography process according to an embodiment of the disclosure.

With reference to FIG. 4, regarding the structure, the phase shift mask 100 may include a substrate 171 and a phase shift pattern layer 172. The phase shift pattern layer 172 is located on the substrate 171 and is disposed corresponding to one of the first pattern region 110 and the second pattern region 120.

One light penetrating through the substrate 171 and another light penetrating through the substrate 171 and the phase shift pattern layer 172 may have different phases. Taking FIG. 5 for example, before penetrating through the phase shift mask 100, light L0 emitted from a light source 880 may have the same of similar phase on a same position A1 (e.g., a place between the light source 880 and the phase shift mask 100). On a position A2 opposite to the light source 880, the phase of light L1 penetrating through the substrate 171 is different from the phase of light L2 penetrating through the substrate 171 and the phase shift pattern layer 172. In an embodiment, the phase of the light L1 penetrating through the substrate 171 and the phase of the light L2 penetrating through the substrate 171 and the phase shift pattern layer 172 may be configured to be different through adjusting a material and/or thickness of the phase shift pattern layer 172.

An optical phase difference (OPD) corresponding to the first pattern region 110 and the second pattern region 120 is basically 180 degrees. For instance, the difference between the phase of the light L1 (for example, expressed by an electric field direction of the light L1) and the phase of the light L2 (for example, expressed by an electric field direction of the light L2) is 180 degrees.

With reference to FIG. 4, FIG. 4 may be a schematic diagram of a phase of light of a portion after the light penetrates through the phase shift mask 100. Taking FIG. 4 as an example, on the same position after the light penetrating through the phase shift mask 100, the optical phase difference between the one light penetrating through the substrate 171 and the another light penetrating through the substrate 171 and the phase shift pattern layer 172 is basically 180 degrees (that is, a corresponding radian is $\pi$).

In an embodiment, the material of the phase shift pattern layer 172 may be identical to or similar to a material of the substrate 171. That is, in an embodiment, the phase of the one light penetrating through the substrate 171 and the phase of the another light penetrating through the substrate 171 and the phase shift pattern layer 172 may be configured to be different through adjusting the thickness of the phase shift pattern layer 172.

In an embodiment, on a position, a corresponding phase angle of light penetrating through the phase shift mask 100 may be calculated through the following angle: $P=2\pi(n-1)T/\lambda$, where P is the phase angle, n is a refractive index of the corresponding phase shift pattern layer 172, T is the thickness of the corresponding phase shift pattern layer 172, and $\lambda$ is a corresponding light wavelength.

In the present embodiment, the phase shift pattern layer 172 is disposed corresponding to the second pattern region 120. That is, the phase shift pattern layer 172 may be located on the second pattern region 120, and the phase shift pattern layer 172 basically is not located on the first pattern region 110.

In an embodiment that is not shown, a phase shift pattern layer similar to the phase shift pattern layer 172 may be disposed corresponding to the first pattern region 110. That is, the phase shift pattern layer similar to the phase shift pattern layer 172 may be located on the first pattern region 110, and the phase shift pattern layer similar to the phase shift pattern layer 172 is basically not located on the second pattern region 120.

In an embodiment that is not shown, the phase shift pattern layer may be located on the first pattern region 110 and on the second pattern region 120, and the thickness of the phase shift pattern layer located on the first pattern region 110 is different from the thickness of the phase shift pattern layer located on the second pattern region 120.

In the present embodiment, the strip patterns 130, 140, 150, and 160 of the second pattern region 120 are long-strip-shaped. For instance, the strip patterns 130, 140, 150, and 160 of the second pattern region 120 are basically rectangular. A length of the rectangle is greater than a width of the rectangle.

In the present embodiment, the strip patterns 130, 140, 150, and 160 of the second pattern region 120 include first strip patterns 130, second strip patterns 140, third strip patterns 150, and fourth strip patterns 160. The first strip patterns 130 have a first extending direction 130*d*. The second strip patterns 140 have a second extending direction 140*d*. The third strip patterns 150 have a third extending direction 150*d*. The fourth strip patterns 160 have a fourth extending direction 160*d*. The second extending direction 140*d* is basically perpendicular to the first extending direction 130*d*. The third extending direction 150*d* is basically parallel to the first extending direction 130*d*. The fourth extending direction 160*d* is basically parallel to the second extending direction 140*d*.

In the present embodiment, the first strip patterns 130 have first widths 130*w* in a direction perpendicular to the first extending direction 130*d*. The second strip patterns 140 have second widths 140*w* in a direction perpendicular to the second extending direction 140*d*. The third strip patterns 150 have third widths 150*w* in a direction perpendicular to the third extending direction 150*d*. Moreover, the fourth strip patterns 160 have fourth widths 160*w* in a direction perpendicular to the first extending direction 130*d*. At least two of the first widths 130*w*, the second widths 140*w*, the third widths 150*w*, and the fourth widths 160*w* may basically be identical. In an embodiment, the first widths 130*w*, the second widths 140*w*, the third widths 150*w*, and the fourth widths 160*w* may basically be identical.

In the present embodiment, a first pitch P1 is provided between two adjacent first strip patterns 130. The first pitches P1 may basically be identical to the first widths 130*w*.

In the present embodiment, a second pitch P2 is provided between two adjacent second strip patterns 140. The second pitches P2 may basically be identical to the second widths 140*w*.

In the present embodiment, a third pitch P3 is provided between two adjacent third strip patterns 150. The third pitches P3 may basically be identical to the third widths 150*w*.

In the present embodiment, a fourth pitch P4 is provided between two adjacent fourth strip patterns 160. The fourth pitches P4 may basically be identical to the fourth widths 160*w*.

In an embodiment, the first widths 130*w*, the second widths 140*w*, the third widths 150*w*, the fourth widths 160*w*, the first pitches P1, the second pitches P2, the third pitches P3, and the fourth pitches P4 may basically be identical.

In the present embodiment, a first pattern pitch P5 may be provided at a closest position between the first strip patterns 130 and the second strip patterns 140. The first pattern pitches P5 may basically be identical to the first widths 130*w*, and/or the first pattern pitches P5 may basically be identical to the second widths 140*w*.

In the present embodiment, a second pattern pitch P6 may be provided at a closest position between the second strip patterns 140 and the third strip patterns 150. The second pattern pitch P6 may basically be identical to the second widths 140*w*, and/or the second pattern pitch P6 may basically be identical to the third widths 150*w*.

In the present embodiment, a third pattern pitch P7 may be provided at a closest position between the third strip patterns 150 and the fourth strip patterns 160. The third pattern pitch P7 may basically be identical to the third widths 150*w*, and/or the third pattern pitch P7 may basically be identical to the fourth widths 160*w*.

In the present embodiment, a fourth pattern pitch P8 may be provided at a closest position between the fourth strip patterns 160 and the first strip patterns 130. The fourth pattern pitch P8 may basically be identical to the fourth widths 160*w*, and/or the fourth pattern pitch P8 may basically be identical to the first widths 130*w*.

In an embodiment, the first widths 130*w*, the second widths 140*w*, the third widths 150*w*, the fourth widths 160*w*, the first pitches P1, the second pitches P2, the third pitches P3, the fourth pitches P4, the first pattern pitch P5, the second pattern pitch P6, the third pattern pitch P7, and the fourth pattern pitch P8 may basically be identical.

In the present embodiment, in a closed region (e.g., the region R1 marked in FIG. 1 or the region R1 depicted in FIG. 2, and the closed region provided in the following paragraphs is the same), the strip patterns are disposed in a rotational symmetry (i.e., C4 rotational symmetry) manner of 90°. Further, the closed region may include a corresponding via region 111, and a rotational symmetry axis may be located on a center of the via region 111.

In an embodiment, through the strip patterns perpendicular to one another (such as the first strip patterns 130 and the second strip patterns 140 perpendicular to each other, the second strip patterns 140 and the third strip patterns 150 perpendicular to each other, the third strip patterns 150 and the fourth strip patterns 160 perpendicular to each other, and/or the fourth strip patterns 160 and the first strip patterns 130 perpendicular to each other), a resolution of exposure may thus be improved.

Figure 3:
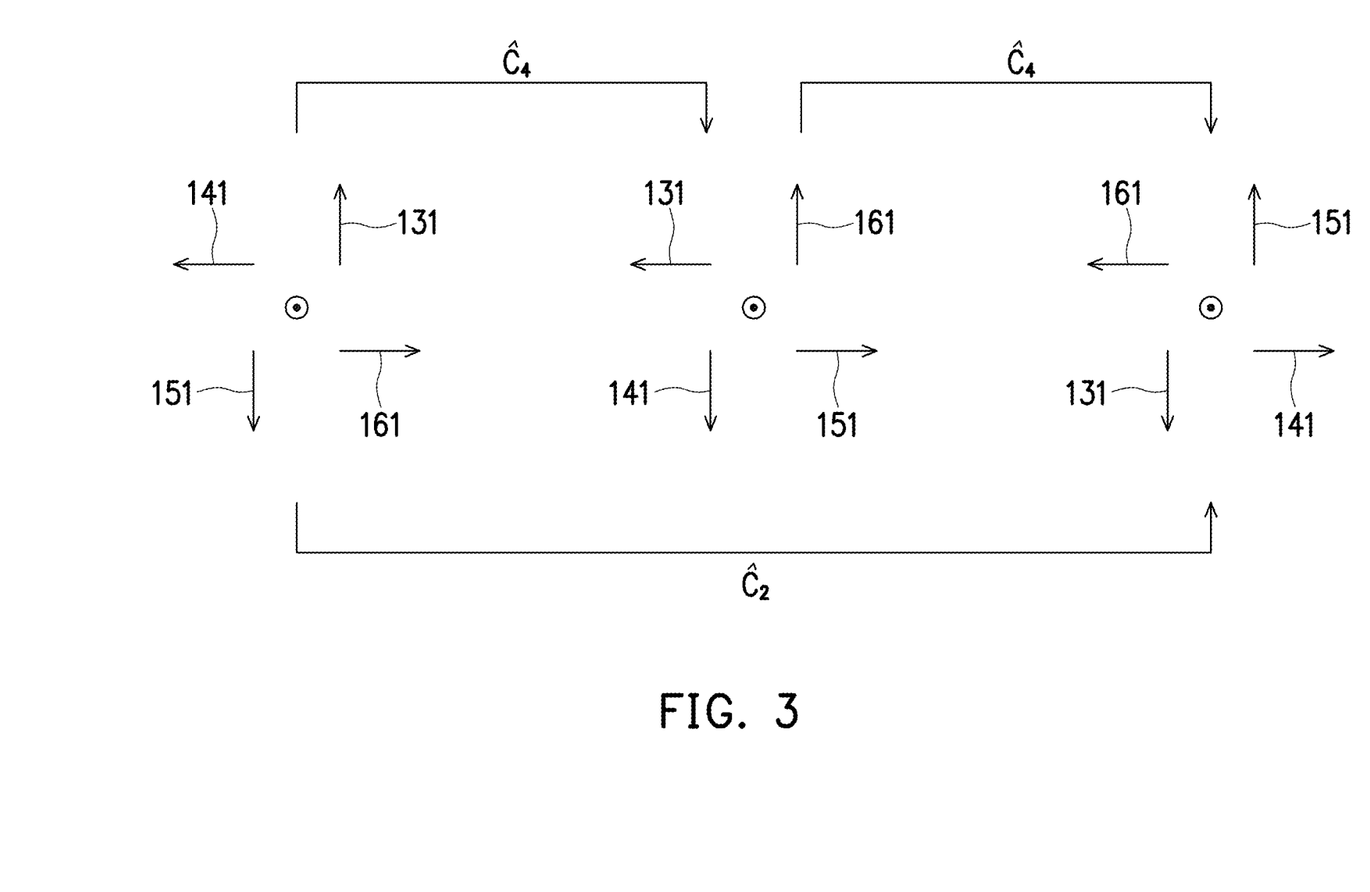
FIG. 3 is a schematic diagram of rotation of the phase shift mask according to an embodiment of the disclosure.

With reference to FIG. 2 and FIG. 3, FIG. 3 may be a schematic diagram of rotation of the phase shift mask 100. In addition, for sake of clarity, corresponding positions and extending directions of one first strip pattern 131 (one of the first strip patterns 130 on a specific position), one second strip pattern 141 (one of the second strip patterns 140 on a specific position), one third strip pattern 151 (one of the third strip patterns 150 on a specific position), and one fourth strip pattern 161 (one of the fourth strip patterns 160 on a specific position) in FIG. 2 are merely depicted in FIG. 3. Further, the rotational symmetry axis in FIG. 3 may be perpendicular to the plane depicted in FIG. 3.

As shown in FIG. 2, in the closed region, the first strip patterns 130 may basically overlap with the second strip patterns 140 after being rotated by 90°. The second strip patterns 140 may basically overlap with the third strip patterns 150 after being rotated by 90°. The third strip patterns 150 may basically overlap with the fourth strip patterns 160 after being rotated by 90°. Moreover, the fourth strip patterns 160 may basically overlap with the first strip patterns 130 after being rotated by 90°.

As shown in FIG. 2, in the closed region, the first strip patterns 130 may basically overlap with the third strip patterns 150 after being rotated by 180° (that is, performing 90° rotation twice in the same rotation direction). The second strip patterns 140 may basically overlap with the fourth strip patterns 160 after being rotated by 180°. The third strip patterns 150 may basically overlap with the first strip patterns 130 after being rotated by 180°. Moreover, the fourth strip patterns 160 may basically overlap with the second strip patterns 140 after being rotated by 180°.

As shown in FIG. 2, in the closed region, the strip patterns are not disposed in a plane symmetry manner. That is, the first strip patterns 130 may not overlap with any one of the second strip patterns 140, the third strip patterns 150, or the fourth strip patterns 160 through a symmetry plane.

In the present embodiment, in a direction parallel to the first extending direction 130*d*, the one having a longest length among the first strip patterns 130 has a corresponding first longest length 130*m*. For instance, first strip patterns 131, 132, and 133 have the first longest length 130*m*. As shown in FIG. 2, in the closed region, the first longest length 130*m* basically is equal to a sum of the second widths 140*w* of all of the second strip patterns 140, a sum of the second pitches P2 between all of the adjacent second strip patterns 140, and the second pattern pitch P6. Taking FIG. 2 for example, the first longest length 130*m* of the first strip patterns 131, 132, and 133 basically is equal to a sum of the following: four second widths 140w, three second pitches P2, and the second pattern pitch P6.

In the present embodiment, in the direction parallel to the first extending direction 130d, the one having a shortest length among the first strip patterns 130 has a corresponding first shortest length 130n. For instance, a first strip pattern 134 has the first shortest length 130n. As shown in FIG. 2, in the closed region, the first shortest length 130n basically is equal to a sum of the second widths 140w of second strip patterns 141, 142, and 143 having the longest length and a sum of the second pitches P2 between all of the adjacent second strip patterns 141, 142, and 143 having the longest length. Taking FIG. 2 for example, the first shortest length 130n of the first strip pattern 134 basically is equal to a sum of the following: three second widths 140w and two second pitches P2.

In the present embodiment, in a direction parallel to the second extending direction 140d, the one having the longest length among the second strip patterns 140 has a corresponding second longest length 140m. For instance, second strip patterns 141, 142, and 143 have the second longest length 140m. As shown in FIG. 2, in the closed region, the second longest length 140m basically is equal to a sum of the third widths 150w of all of the third strip patterns 150, a sum of the third pitches P3 between all of the adjacent third strip patterns 150, and the third pattern pitch P7. Taking FIG. 2 for example, the second longest length 140m of the second strip patterns 141, 142, and 143 basically is equal to a sum of the following: four third widths 150w, three third pitches P3, and the third pattern pitch P7.

In the present embodiment, in the direction parallel to the second extending direction 140d, the one having the shortest length among the second strip patterns 140 has a corresponding second shortest length 140n. For instance, a second strip pattern 144 has the second shortest length 140n. As shown in FIG. 2, in the closed region, the second shortest length 140n basically is equal to a sum of the third widths 150w of third strip patterns 151, 152, and 153 having the longest length and a sum of the third pitches P3 between all of the adjacent third strip patterns 151, 152, and 153 having the longest length. Taking FIG. 2 for example, the second shortest length 140n of the second strip pattern 144 basically is equal to a sum of the following: three third widths 150w and two third pitches P3.

In the present embodiment, in a direction parallel to the third extending direction 150d, the one having the longest length among the third strip patterns 150 has a corresponding third longest length 150m. For instance, third strip patterns 151, 152, and 153 have the third longest length 150m. As shown in FIG. 2, in the closed region, the third longest length 150m basically is equal to a sum of the fourth widths 160w of all of the fourth strip patterns 160, a sum of the fourth pitches P4 between all of the adjacent fourth strip patterns 160, and the fourth pattern pitch P8. Taking FIG. 2 for example, the third longest length 150m of the third strip patterns 151, 152, and 153 basically is equal to a sum of the following: four fourth widths 160w, three fourth pitches P4, and the fourth pattern pitch P8.

In the present embodiment, in the direction parallel to the third extending direction 150d, the one having the shortest length among the third strip patterns 150 has a corresponding third shortest length 150n. For instance, a third strip pattern 154 has the third shortest length 150n. As shown in FIG. 2, in the closed region, the third shortest length 150n basically is equal to a sum of the fourth widths 160w of fourth strip patterns 161, 162, and 163 having the longest length and a sum of the fourth pitches P4 between all of the adjacent fourth strip patterns 161, 162, and 163 having the longest length. Taking FIG. 2 for example, the third shortest length 150n of the third strip pattern 154 basically is equal to a sum of the following: three fourth widths 160w and two fourth pitches P4.

In the present embodiment, in a direction parallel to the fourth extending direction 160d, the one having the longest length among the fourth strip patterns 160 has a corresponding fourth longest length 160m. For instance, fourth strip patterns 161, 162, and 163 have the fourth longest length 160m. As shown in FIG. 2, in the closed region, the fourth longest length 160m basically is equal to a sum of the first widths 130w of all of the first strip patterns 130, a sum of the first pitches P1 between all of the adjacent first strip patterns 130, and the first pattern pitch P5. Taking FIG. 2 for example, the fourth longest length 160m of the fourth strip patterns 161, 162, and 163 basically is equal to a sum of the following: four first widths 130w, three first pitches P1, and the first pattern pitch P5.

In the present embodiment, in the direction parallel to the fourth extending direction 160d, the one having the shortest length among the fourth strip patterns 160 has a corresponding fourth shortest length 160n. For instance, a fourth strip pattern 164 has the fourth shortest length 160n. As shown in FIG. 2, in the closed region, the fourth shortest length 160n basically is equal to a sum of the first widths 130w of the first strip patterns 131, 132, and 133 having the longest length and a sum of the first pitches P1 between all of the adjacent first strip patterns 131, 132, and 133 having the longest length. Taking FIG. 2 for example, the fourth shortest length 160n of the fourth strip pattern 164 basically is equal to a sum of the following: three first widths 130w and two first pitches P1.

Based on the above, through the phase shift mask 100 provided by the present embodiment, a side lobe effect may be reduced in a photolithography process.

Figure 5:
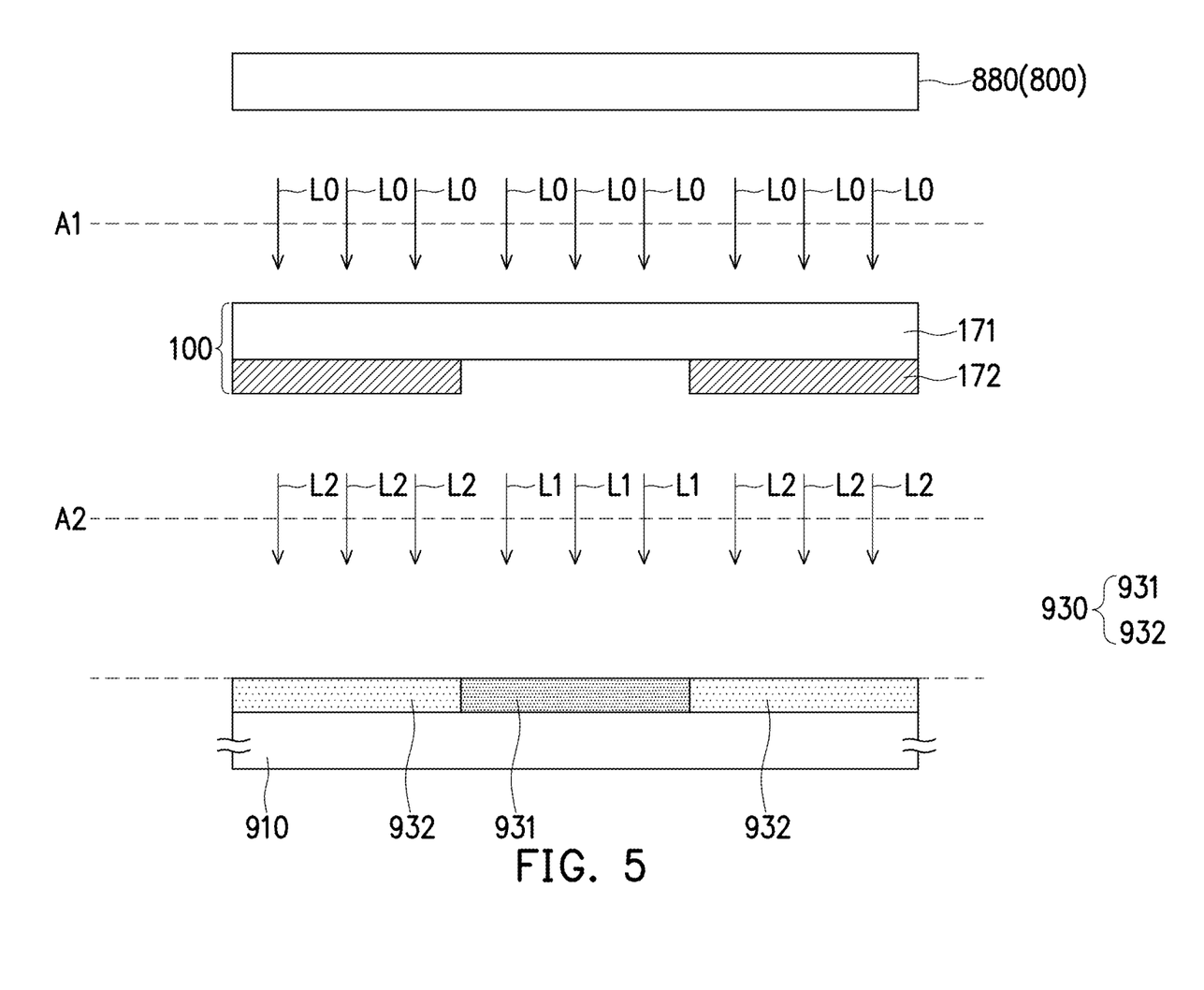
FIG. 5 is a schematic side view of a manufacturing method of a portion of a semiconductor device according to an embodiment of the disclosure.

FIG. 5 is a schematic side view of a manufacturing method of a portion of a semiconductor device according to an embodiment of the disclosure.

With reference to FIG. 5, the phase shift mask 100 may be assembled to an exposure apparatus 800 to expose the photoresist layer 930 on the transferred object 910. The exposure apparatus 800 includes the light source 880 and a corresponding light guide device (e.g., a prism, a lens, and/or a reflective mirror, not shown). The photoresist layer 930 may include a corresponding high exposure region 931 and a corresponding low exposure region 932. Next, development, cleaning, etching, and/or plating or deposition may be correspondingly adopted to form a corresponding portion in a semiconductor device. The semiconductor device may include a device including a semiconductor material or a film layer or a device formed through a semiconductor process.

In an embodiment, the transferred object 910 may include a substrate, a film layer located on the substrate, or an appropriate transferred object in any semiconductor device process. The substrate may include a conductive substrate, a semiconductor substrate, or an insulating substrate. The substrate may include an organic substrate or an inorganic substrate. The substrate may include a rigid substrate or a flexible substrate. The film layer may include a single film layer or a plurality of layers of film layers. The film layer may include a patterned film layer or an unpatterned film layer. The film layer may include a conductive layer, a semiconductor layer, or an insulating layer. The film layer may include an organic layer or an inorganic layer.

In the present embodiment, corresponding exposure steps may be performed through the phase shift mask 100 by adopting a positive tone development (PTD) manner. Compared to a negative tone development (NTD) manner, the positive tone development manner may exhibit a favorable photoresist shape and/or reduced photoresist thickness loss.

In an embodiment, through the foregoing manner, a corresponding via pattern may be formed on the transferred object 910 through the via region 111 of the phase shift mask 100.

Figure 6:
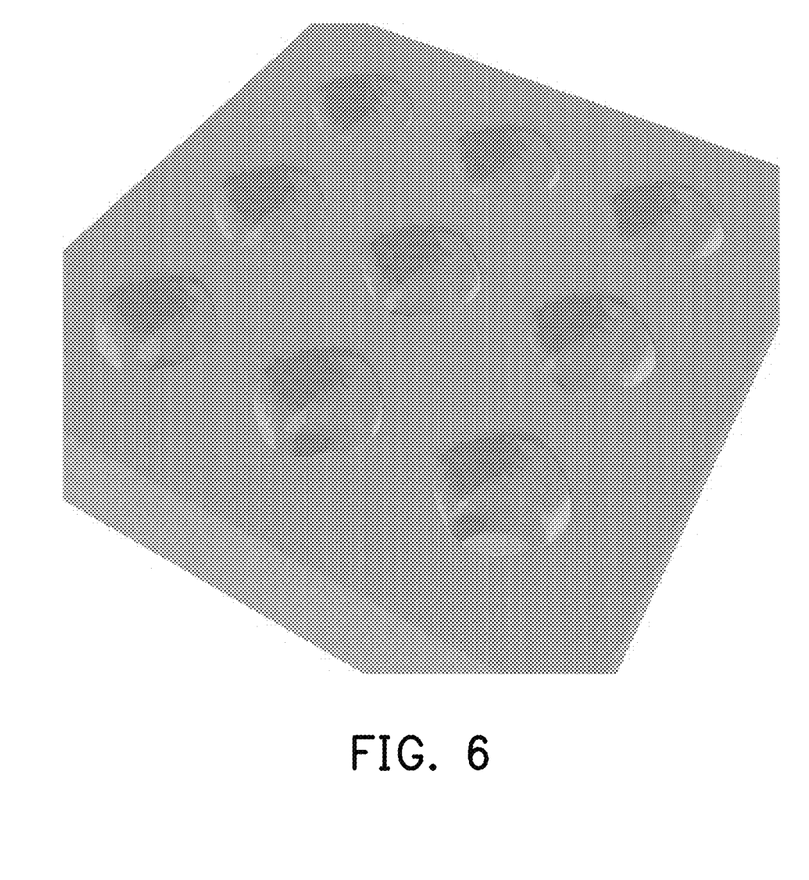
FIG. 6 is a schematic diagram of simulation of the photolithography process of the phase shift mask according to an embodiment of the disclosure.

FIG. 6 is a schematic diagram of simulation of the photolithography process of a phase shift mask according to an embodiment of the disclosure. For instance, FIG. 6 is, for example, a schematic diagram of simulation of a photoresist low exposure region (e.g., similar to the low exposure region 932 in FIG. 5) corresponding to the region R2 in FIG. 1 after exposure is performed on a photoresist layer (e.g., similar to the photoresist layer 930 on the transferred object 910 in FIG. 5) on a transferred object through the phase shift mask 100.

As shown in FIG. 6, through a phase shift mask provided by an embodiment of the disclosure, the side lobe effect may be reduced in the photolithography process. Therefore, a process resolution of a formed device (e.g., the via pattern, a via structure, and/or a corresponding connection line) may be correspondingly improved, and a corresponding device size may further be lowered.

In view of the foregoing, through the phase shift mask provided by the disclosure, the side lobe effect may be reduced in the photolithography process. Therefore, the formed process resolution may be correspondingly improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A phase shift mask, suitable for forming a via pattern on a transferred object, wherein the phase shift mask has a first pattern region and a second pattern region, and the phase shift mask comprises:
    a substrate; and
    a phase shift pattern layer, located on the substrate, disposed corresponding to one of the first pattern region and the second pattern region, wherein
        an optical phase difference corresponding to the first pattern region and the second pattern region is basically 180 degrees,
        the first pattern region has a via region away from the second pattern region, and
        the second pattern region comprises a plurality of strip patterns surrounding the via region, wherein the strip patterns are disposed in a C4 rotational symmetry manner in a closed region, and the via region is located in the closed region.

2. The phase shift mask according to claim 1, wherein the phase shift pattern layer is disposed corresponding to the second pattern region.

3. The phase shift mask according to claim 1, wherein the strip patterns are not disposed in a plane symmetry manner in the closed region.

4. The phase shift mask according to claim 1, wherein widths of the strip patterns are basically identical to pitches among adjacent strip patterns.

5. The phase shift mask according to claim 1, wherein the strip patterns comprise a plurality of first strip patterns and a plurality of second strip patterns in the closed region, the first strip patterns have a first extending direction, the second strip patterns have a second extending direction, the first extending direction is basically perpendicular to the second extending direction, and the first strip patterns and the second strip patterns are disposed in a rotational symmetry manner.

6. The phase shift mask according to claim 5, wherein the strip patterns comprise a plurality of third strip patterns in the closed region, the third strip patterns have a third extending direction, the first extending direction is basically parallel to the third extending direction, and the first strip patterns and the third strip patterns are disposed in a rotational symmetry manner.

7. A manufacturing method of a semiconductor device, comprising:
    exposing a photoresist layer on a transferred object through the phase shift mask according to claim 1.

8. The manufacturing method of the semiconductor device according to claim 7, wherein the step of exposing is positive tone development.

* * * * *